INVENTORS
PETER LEUTHOLD
PETRUS J. VAN GERWEN
BY
Frank R. Trifari
AGENT

INVENTORS
PETER LEUTHOLD
PETRUS J.VAN GERWEN
BY
AGENT

INVENTORS
PETER LEUTHOLD
PETRUS J. VAN GERWEN
BY
Frank R. Jifoni
AGENT

INVENTORS
PETER LEUTHOLD
PETRUS J. VAN GERWEN
BY
AGENT

INVENTORS
PETER LEUTHOLD
PETRUS J. VAN GERWEN
BY
AGENT

July 21, 1970 P. LEUTHOLD ET AL 3,521,170

TRANSVERSAL DIGTAL FILTERS HAVING ANALOG TO DIGITAL CONVERTER FOR ANALOG SIGNALS

Filed Feb. 28, 1967 6 Sheets-Sheet 6

INVENTORS
PETER LEUTHOLD
PETRUS J. VAN GERWEN
BY

AGENT

United States Patent Office 3,521,170
Patented July 21, 1970

3,521,170

TRANSVERSAL DIGITAL FILTERS HAVING ANALOG TO DIGITAL CONVERTER FOR ANALOG SIGNALS

Peter Leuthold, Neuhausen, Switzerland, and Petrus Josephus van Gerwen, Emmasingel, Eindhoven, Netherlands, assignors, by mesne assignments, to U.S. Philips Corporation, New York, N.Y., a corporation of Delaware Filed Feb. 28, 1967, Ser. No. 619,324
Claims priority, application Netherlands, Mar. 5, 1966, 6602900
Int. Cl. H03k 7/00
U.S. Cl. 325—323 23 Claims

ABSTRACT OF THE DISCLOSURE

A filter circuit for analog signals is disclosed in which the analog signals are first converted to a pulse sequence characteristic of the signal, for example, by means of a delta modulator. The pulse sequence is applied to a shift register having a plurality of output terminals. The contents of the shift register are shifted by a control signal. The outputs of the shift register are combined after being subjected to predetermined attenuations, and the combined signal is decoded and filtered.

The invention relates to a filter for analog signals derived from a separate signal source. In constructing filters for analog signals, for example speech signals and music signals, it is, in general, sufficient to take into account the amplitude-frequency characteristic. However, filters for analog signals may be employed in cases in which they have, in addition, to fulfill the requirement that a linear phase-frequency characteristic must be approached as well as possible. This applies in particular to filters for signals, the waveforms of which have to be maintained as well as possible, for example, in the case of filters for telemetric signals and receiving filters for telegraph signals. The additional requirement of a linear phase-frequency characteristic complicates the construction of such filters.

It is the object of the invention to provide a new conception of a filter of the kind set forth, which has not only a construction suitable for use in integrated circuits but also the desired amplitude-frequency characteristic together with an accurately linear phase-frequency characteristic are realized, and, in addition, the amplitude-frequency characteristic can be adjusted in a simple manner, while maintaining its shape and the linear phase-frequency characteristic.

The filter according to the invention is characterized in that it comprises an analog-to-digital converter, connected to the signal source and converting the analog signal from the signal source into a pulse sequence characteristic of said signal, and, in addition, a shift register and a decoder, the shift register being connected to the output of the analog-to-digital converter and comprising a number of shift register elements, the contents of which are shifted by a control generator connected to the shift register, with a shift period smaller than half the period of the highest frequency to be filtered in the analog signal, said elements of the shift register being connected through attenuation networks to a combination device which combines the pulse signals shifted in the shift register elements each time over a time interval equal to the shift period.

The invention and its advantages will now be described more fully with reference to the figures.

FIG. 1 shows a filter according to the invention, in which delta-modulation is used for the analog-to-digital conversion, while

Figure 1:
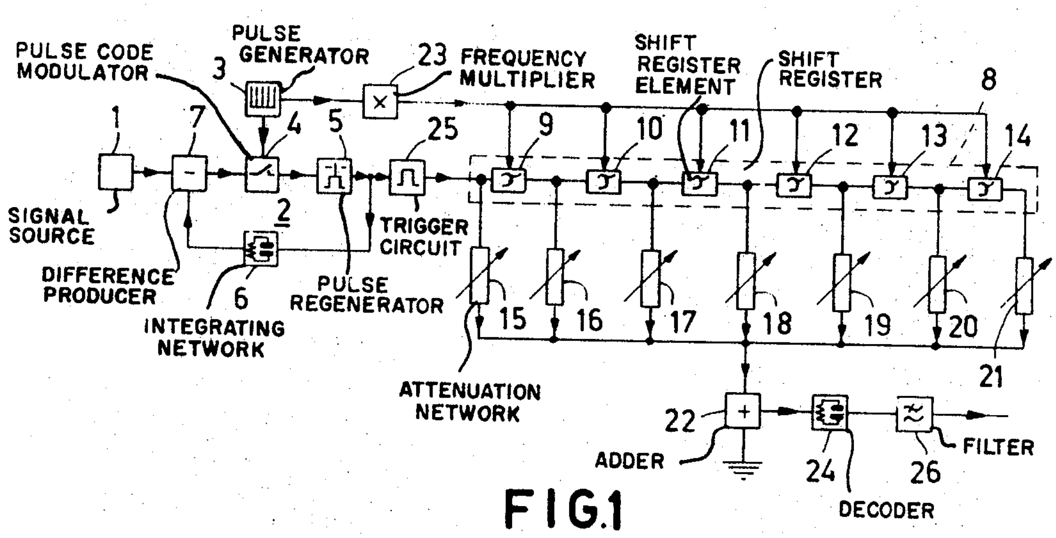

The filter shown in FIG. 1 serves for analog signals from a signal source 1, the frequencies of which lie, for example, between 0 c./s. and 10 kc./s.

In order to obtain a given filter characteristic, the filter according to the invention comprises an analog-to-digital converter 2, connected to the signal source 1 and converting the analog signal from the signal source 1 into a pulse sequence, which pulses are characteristic of the analog signal by their presence or absence. The analog-to-digital converter 2 may be formed particularly by a delta modulator, which is formed by a pulse code modulator 4, connected to the pulse generator 3, the output pulses of which modulator 4 are applied through a pulse regenerator 5 to a decoder 6 formed by an integrating network. The output of the decoder 6, like the output of the signal source 1, is connected to a difference producer 7 for obtaining a difference signal which controls the pulse code modulator 4.

The output of the delta modulator 2 is furthermore connected to a shift register 8, which comprises a number of elements 9, 10, 11, 12, 13, 14, the contents of which are shifted by a control generator with a shift period $\tau$ smaller than half the period of the highest frequency to be filtered in the analog signal. The elements 9, 10, 11, 12, 13, 14 of the shaft register 8 are connected through attenuation networks 15, 16, 17, 18, 19, 20, 21 to a combination device 22, which combines the pulse signals shifted in the shift register elements each time over a time interval $\tau$. The shift register 8 may be formed by a number of bistable trigger circuits and the control-generator may be formed by the pulse generator 3, which may be followed by a frequency multiplier 23.

The output of the combination device 22 is connected to a decoder 24, the influence of which on the analog signal to be filtered is inverse to that of the delta modulator 2, which means that with a direct application of the output pulses of the delta modulator 2 to the decoder 24 an analog signal is obtained at the output of the decoder 24, which analog signal corresponds with the analog signal applied to the delta modulator 2, apart from the quantization. The decoder 24 has, particularly, the shape of an integrating network, which corresponds with the integrating network 6, operating as a decoder in the delta modulator 2.

In the analog-to-digital converter formed by the delta modulator 2 to the analog signal to be filtered, in which frequencies up to 10 kc./s. are found, is applied to the difference producer 7, to which is applied, in addition, the output signal of the integrating network 6, operating as a decoder. The difference signal at the output of the difference producer 7 controls the pulse code modulator 4, to which the pulse generator 3 applies equidistant pulses with a pulse repetition frequency $\omega_p$ (rad./sec.) which is at least twice the maximum frequency to be filtered in the analog signal; the pulse repetition frequency is, for example, 32 kc./s. According as the instantaneous value of the output signal of the decoder 6 is smaller or larger than the analog signal at the input of the difference producer 7, a difference signal of negative or positive polarity is produced at the output of the difference producer 7 and in accordance with this polarity of the difference signal the pulses from the pulse generator 3 are present or absent at the output of the pulse code modulator 4. These pulses are applied through a pulse regenerator 5 for suppressing the variations of amplitude, duration, shape or instant of occurrence involved in the pulse code modulator 4, on the one hand to a pulse broadener 25, formed by a trigger connected to the shift register 8, and on the other hand to the integrating network 6, operating as a decoder, the output signal of which is compared in the difference producer 7 with the analog signal from the signal source 1. The time constant of the integrating network 6 is, for example, 1 msec.

The circuit described above tends to render the difference signal zero, so that the output signal of the integrating network 6 is a quantized approximation of the analog signal to be filtered. If, for example, a difference signal of of negative polarity appears, a pulse will be applied to the integrating network 6 through the pulse code modulator 4, said pulse counteracting the negative difference signal, whereas conversely at a positive difference signal the pulse code modulator 4 does not apply a pulse to the integrating network 6, so that the prolongation of the positive difference signal is counteracted.

In this way at the output of the delta modulator 2 a sequence of pulses is produced which pulses characterize the analog signal by their presence or absence. This sequence of pulses, subsequent to pulse widening in the pulse widener 25, is applied for further processing to the decoder 24 through the shift register 8, whose elements 9, 10, 11, 12, 13, 14 are connected by means of the attenuation networks 15, 16, 17, 18, 19, 20, 21 and the combination device 22 to the input of the decoder 24. The filter effect is produced in the circuit formed by the shift register 8, the attentuation networks, 15, 16, 17, 18, 19, 20, 21 and the combination device 22, since in the absence of this circuit between the delta modulator 2 and the decoder 24 just the analog signal applied to the delta modulator 2 would appear at the output of the decoder 24, apart from a slight amount of quantization noise, because the delta modulator 2 and the decoder 24 are chosen so as to be inverse. If, for example, an analog signal with the frequency spectrum $S(\omega)$ is applied to the input of the filter and if the circuit formed by the shift register 8, the attenuation networks 15, 16, 17, 18, 19, 20, 21 and the combination device 22 has, for the pulse signals applied thereto, a transfer characteristic $H(\omega)$, an analog signal having the frequency spectrum:

$$H(\omega)\ S(\omega) \qquad (1)$$

appears at the output of the decoder 24.

It is characteristic of the device according to the invention that the filtering process of the analog signal is performed by the filtering effect of the circuit formed by the shift register 8, the attentuation networks 15, 16, 17, 18, 19, 20, 21 and the combination device 22 on the output pulses of the analog-to-digital converter 2. This new theory results in two notable effects: in the first place, analog signals can be filtered with any amplitude-frequency characteristic together with an accurately linear phase-frequency characteristic and in the second place, it is found that the filtering effect given by the above Formula 1 is completely independent of the pulse code employed. The desired filter characteristic is obtained by a suitable choice of the transfer coefficients of the attenuation networks 15, 16, 17, 18, 19, 20, 21, connected to the shift register elements with a given shift period $\tau$ of the shift register elements 9, 10, 11, 12, 13, 14.

The filter shown in FIG. 1 forms a low-pass filter for analog signals having a linear phase-frequency characteristic, a cosinusoidal amplitude-frequency characteristic and a cut off frequency $\omega_0$ equal to 1/10 of the pulse repetition frequency $\omega_p$. For this purpose, as will be explained mathematically hereinafter, the attenuation networks are made equal in pairs, starting from the ends of the shift register 8, which means that the transfer coefficients of the attenuation networks 15, 21 are both $C_3$, of the attenuation networks 16, 20 both $C_2$, of the attenuation networks 17, 19 both $C_1$, whereas $C_0$ is the transfer coefficient of the attenuation network 18; the consecutive transfer coefficients $C_k$ are chosen in accordance with the formula $$C_k=\frac{\cos k\pi 5}{2.5\pi(1-0.16k^2)}$$

whereas the shift period $\tau$ of the shift register is rendered equal to one period of the pulse repetition frequency $\omega_p$. It should furthermore be noted that the number of shift register elements and the number of attenuation networks may be extended at will. In the embodiment shown, for example, 14 shift register elements and 15 attenuation networks are used.

The operation of the filter described above will now be explained more fully with reference to the time diagrams of FIG. 2; FIG. 2*a* illustrates the analog signal applied to the delta modulator 2 and lying in the frequency band from 0 c./s. to 10 kc./s. In particular the analog signal is formed by a triangular voltage the leading and trailing edges of which appear during the time intervals $(t_1, t_2)$, and $(t_2, t_3)$ respectively, and a trapezoidal voltage, the leading edge of which appears during the interval $(t_4, t_5)$.

In the delta modulator 2 the analog signal illustrated in FIG. 2*a* is converted into a pulse sequence, the delta modulator 2 being modulated to the maximum by the edges of the analog signal, which means that during the time intervals $(t_1,t_2)$ and $(t_4,t_5)$ of the leading edges of the analog signal the pulses of the pulse generator 3 are all passed, whereas during the time interval $(t_2,t_3)$ of the trailing edge of the analog signal they are all suppressed and during the time intervals of constant voltage $(t_3,t_4)$ and $(t>t_5)$ the pulses of the pulse generator 3 are alternately suppressed and passed. Thus the delta modulator 2 produces from the analog signal of FIG. 2*a* a pulse sequence of the form illustrated in FIG. 2*b*, while at the output of the pulse broadener 25 there appears the pulse sequence of FIG. 2*c*, which pulse sequence is obtained by broadening the pulse sequence of FIG. 2*b* to the period of the pulse repetition frequency $\omega_p$.

In the shift register 8 the pulse pattern illustrated in FIG. 2*c* is shifted in the successive shift register elements over a shift period $\tau$ equal to one period of the pulse repetition frequency $\omega_p$ and applied through the consecutive attenuation networks and the associated transfer coefficients to the combination device 22. At the outputs of the 15 consecutive attenuation networks there thus occur 15 output voltages, which are illustrated in the time diagram of FIG. 2*d* one below the other.

In the combination device 22 the signals illustrated in FIG. 2*d* are combined and by this combination the signal illustrated in FIG. 2*e* is obtained, which is composed of a continuously varying signal *a* and a stepwise varying signal *b*, superimposed on the former and meandering in the rhythm of the shift period $\tau$ of the shift register 8 around the signal *a*.

Subsequent to the decoding of the signal illustrated in FIG. 2*e* by means of the integrating network 24, the ouput of the filter provides the signal shown in FIG. 2*f*, which corresponds to the output signal of a lowpass filter having a cosinusoidal amplitude-frequency characteristic up to a cutoff frequency $\omega_0$ and a linear phase-frequency characteristic, if the analog signal of FIG. 2*a* is applied to the last-mentioned filter. Although the integrating network 24 having a time constant of 1 msec. has already attenuated the signal *b*, varying stepwise with the shift period, to a marked extent, the signal *b* may, if desired, be further attenuated without affecting the shape of the amplitude-frequency characteristic and the linearity of the phase-frequency characteristic by means of a simple suppression filter 26, formed by a lowpass filter, for example formed by a series resistor and a shunt capacitor, connected to the output of the integrating network 24, since the undesirable frequency components of the signal *b* are lying at an adequate frequency distance from the pass region. In the embodiment shown this frequency distance is, for example, at least 8 times the cutoff frequency $\omega_0$.

As stated above, the filtering effect is performed in the circuit formed by the shift register 8, the attenuation networks 15, 16, 17, 18, 19, 20, 21 and the combination device 22 and the filter characteristics of the filter for analog signals are given by the transfer characteristic $H(\omega)$ of said circuit for the pulse signals applied thereto. It will now be proved mathematically that by this arrangement any desired amplitude-frequency characteristic can be realized with a linear phase-frequency characteristic.

The basic point of the mathematical dealing with the circuit of FIG. 1, formed by the shift register 8, the attenuation networks 15, 16, 17, 18, 19, 20, 21 and the combination device 22, is an arbitrary component of angular frequency $\omega$ and amplitude A in the frequency spectrum of the pulses applied to the shift register 8, said component being written in a complex form as:

$$Ae^{j\omega t} \quad (2)$$

In the successive shift register elements 9, 10, 11, 12, 13, 14 the spectrum component is shifted over time intervals $\tau$, $2\tau$, $3\tau$, $4\tau$, $5\tau$, $6\tau$ and this spectrum component shifted over said time intervals can be written as follows:

$$Ae^{j\omega(t-\tau)},\ Ae^{j\omega(t-2\tau)},\ Ae^{j\omega(t-3\tau)},\ Ae^{j\omega(t-4\tau)}$$
$$Ae^{j\omega(t-5\tau)},\ Ae^{j\omega(t-6\tau)}$$

Through the relevant attenuation networks 15, 16, 17, 18, 19, 20, 21, the transfer coefficients of which are pairwise equal and are designated by $C_3$, $C_2$, $C_1$, $C_0$, $C_1$, $C_2$, $C_3$ respectively, this spectrum component is applied to the combination device 22, which thus provides an output signal:

$$C_3Ae^{j\omega t}+C_2Ae^{j\omega(t-\tau)}+C_1Ae^{j\omega(t-2\tau)}+C_0Ae^{j\omega(t-3\tau)}$$
$$+C_1Ae^{j\omega(t-4\tau)}+C_2Ae^{j\omega(t-5\tau)}+C_3Ae^{j\omega(t-6\tau)} \quad (3)$$

An arbitrary component $Ae^{j\omega t}$ in the frequency spectrum of the pulses applied to the shift register provides an output signal given by the Formula 3, so that the transfer characteristic $H(\omega)$ of the circuit formed by the shift register, the attenuation networks and the combination device is given by $$H(\omega)=C_3+C_2e^{-j\omega\tau}+C_1e^{-2j\omega\tau}+C_0e^{-3j\omega\tau}$$
$$+C_1e^{-4j\omega\tau}+C_2e^{-5j\omega\tau}+C_3e^{-6j\omega\tau} \quad (4)$$

Combining the terms with equal transfer coefficients gives:

$$H(\omega)=C_3(1+e^{-6j\omega\tau})+C_2(e^{-j\omega\tau}+e^{-5j\omega\tau})$$
$$+C_1(e^{-2j\omega\tau}+e^{-4j\omega\tau})+C_0e^{-3j\omega\tau}$$

or else $$H(\omega)=C_3e^{-3j\omega\tau}(e^{3j\omega\tau}+e^{-3j\omega\tau})+C_2e^{-3j\omega\tau}(e^{2j\omega\tau}+e^{-2j\omega\tau})$$
$$+C_1e^{-3j\omega\tau}(e^{-j\omega\tau}+e^{-j\omega\tau})+C_0e^{-3j\omega\tau}$$

and therefore:

$$H(\omega)=(C_0+2C_1\cos\omega\tau+2C_2\cos$$
$$2\omega\tau+2C_3\cos 3\omega\tau)e^{-3j\omega\tau} \quad (5)$$

Formula 5 gives the transfer characteristic $H(\omega)$ of the circuit formed by the shift register 8, the attenuation networks 15, 16, 17, 18, 19, 20, 21 and the combination device 22 and in view of the considerations given above, also that of the filter of FIG. 1 for analog signals. The amplitude-frequency characteristic $\psi(\omega)$ is represented by:

$$\psi(\omega)=(C_0+2C_1\cos\omega\tau+2C_2\cos$$
$$2\omega\tau+2C_3\cos 3\omega\tau) \quad (6)$$

whereas the phase-frequency characteristic $\varphi(\omega)$ is given by:

$$\varphi(\omega)=-3\omega\tau \quad (7)$$

It thus appears that the phase varies exactly linearly with the frequency of the components in the spectrum of the pulse signals applied to the shift register 8 and hence also exactly linearly with the frequency of the components in the spectrum of the analog signal applied to the filter. With a variation of the transfer coefficients $C_0$, $C_1$, $C_2$ and $C_3$ the shape of the amplitude-frequency characteristic varies, but the linearity of the phase-frequency characteristic is not affected. The measures in accordance with the invention therefore yield the very remarkable effect, that while a linear phase-frequency characteristic is maintained, any amplitude-frequency characteristic can be obtained by suitable choice of the transfer coefficients $C_0$, $C_1$, $C_2$, $C_3$ of the attenuation networks.

The foregoing considerations may simply be extended to a shift register 8 having an arbitrary number of elements, the amplitude-frequency characteristic then having the form:

$$\psi(\omega)=C_0+\sum_{1}^{N}2C_k\cos k\omega\tau \quad (8)$$

and the phase-frequency characteristic presenting an accurately linear relationship according to:

$$\varphi(\omega)=-N\omega\tau \quad (9)$$

For the shape of the amplitude-frequency characteristic there thus appears a Fourier series expanded in the terms $C_k \cos k\omega\tau$, the periodicity $\Omega$ of which is given by the relation:

$$\Omega\tau=2\pi \quad (10)$$

In order to obtain a particular amplitude-frequency characteristic the coefficients $C_k$ in the Fourier expansion can simply be calculated mathematically. If, for example, a given amplitude-frequency characteristic $\Psi(\omega)$ is desired, it applies to the coefficients $C_k$ that $$C_k=\frac{1}{\Omega}\int_0^{\Omega}\psi(\omega)\cos k\omega\tau d\omega \quad (11)$$

The coefficients $C_k$ being known, the shape of the amplitude-frequency characteristic is completely determined, but the periodic behaviour of the terms $C_k \cos k\omega\tau$ in the Fourier expansion must be considered more in detail. All terms $C_k \cos k\omega\tau$ assume each time after the periodicity $\Omega$ the same value, which results in that the amplitude-frequency characteristic is repeated with the periodicity $\Omega$, which is illustrated in detail by the amplitude-frequency characteristic of FIG. 3. If, for example, a lowpass filter having a pass region indicated by the curve *c* is desired, the pass region is repeated over a frequency interval equal to the periodicity $\Omega$ and in this manner the additional pass ranges illustrated by the curves *d* and *e* are formed, the centres of which are spaced apart by a frequency interval $\Omega$ from each other. These additional pass ranges *d* and *e* include the frequency components of the stepwise varying signal *b* of FIG. 2*e*.

In practice these additional pass ranges *d* and *e* are not disturbing, since, with an adequately large value of the periodicity $\tau$, or, which is the same according to Formula 10, with a sufficiently small value of the shift period $\tau$, the frequency interval between the desired pass region *c* and the subsequent additional pass regions *d*, *e* can be made sufficiently large, so that these additional pass regions *d*, *e* can be suppressed by a particularly simple suppression filter 26, connected to the output of the integrating network 24 without affecting in any way the amplitude-frequency characteristic and the linear phase-frequency characteristic in the desired pass region *c*. In the practical embodiment described with reference to the time diagrams of FIG. 2, the periodicity $\Omega$ is ten times the cutoff frequency $\omega_0$ of the desired pass region *c* and the suppression filter 26 is formed by a series resistor and a shunt capacitor.

Before further explaining the practical embodiment of FIG. 2, a more detailed embodiment of the device shown in FIG. 1 will be described with reference to FIG. 4, in which elements corresponding to those of FIG. 1, are designated by the same reference numerals.

In this arrangement the combination device is formed by a resistor 27 and the ends of the shift register elements 9, 10, 11, 12, 13, 14 are connected to the combination device constituted by the resistor 27 through adjustable attenuation resistors 28, 29, 30, 31, 32, 33, 34, which, together with the resistor 27, constitute the adjustable attenuation networks. If the value of one of the attenuation resistors is denoted by $R_k$ and if the value of the resistance $r$ of the combination device 27 is much smaller than $R_k$, the transfer coefficient is $r/R_k$, since the relevant adjustable attenuation resistor $R_k$ and the resistor 27 of the combination device together form a potentiometer.

The ends of the shift register elements 9, 10, 11, 12, 13, 14 are furthermore provided with phase inverter stages 35, 36, 37, 38, 39, 40, 41, so that phase-inverted pulse signals can be derived from the shift register elements 9, 10, 11, 12, 13, 14, which is important for obtaining negative coefficients $C_k$ in the Fourier expansion according to the Formula 11, since when designing a filter of a given amplitude-frequency characteristic, some coefficients $C_k$ in the Fourier expansion may have a negative value.

This measure provides as essential extension of the possibilities of application, since, if the transfer coefficients of the attenuation resistors 28, 29, 30, 31, 32, 33, 34 starting from the extreme shift register elements 9, 14 are made equal in pairs and if they are designated like in FIG. 1 by $C_3$, $C_2$, $C_1$ and if the transfer coefficient associated with the attenuation resistor 31 $C_0$ is made equal to zero, whereas, in contrast to the embodiment of FIG. 1, the phase-inverted pulse signal is applied to the attenuation resistors 32, 33, 34, then the transfer characteristic of the network may be written in the manner described above as:

$$H(\omega)=C_3(e^{3j\omega\tau}-e^{-3j\omega\tau})e^{-3j\omega\tau}+C_2(e^{2j\omega\tau}-e^{-2j\omega\tau})e^{-3j\omega\tau}+C_1(e^{j\omega\tau}-e^{-j\omega\tau})e^{-3j\omega\tau}$$

or:

$$H(\omega)=(2C_1 \sin \omega\tau+2C_2 \sin 2\omega\tau+2C_3 \sin 3\omega\tau)\ je^{-3j\tau\omega}$$

The transfer characteristic thus shows an amplitude-frequency characteristic $\Psi(\omega)$ expanded in sine terms and a linear phase-frequency characteristic $\varphi(\omega)$, which, in accordance with the phase factor $je^{-3j\omega\tau}$, exhibits the remarkable property of having a phase shift of $\pi/2$ with respect to the linear phase-frequency characteristic of the filter shown in FIG. 1.

The foregoing considerations may again be expanded in an arbitrary number of shift register elements, while the amplitude-frequency characteristic is represented by a Fourier series expanded in sine terms:

$$\psi(\omega)=\sum_{1}^{N} 2C_k \sin k\omega\tau \qquad (12)$$

with a periodicity $\Omega$, given by the relation:

$$\Omega\ \tau=2\pi$$

whilst it applies to the coefficients $C_k$ that:

$$C_k=\frac{1}{\Omega}\int_0^{\Omega}\psi(\omega)\ \sin k\omega\tau d\omega \qquad (13)$$

As in the embodiment of FIG. 1, the phase-frequency characteristic $\varphi$ $(\omega)$ also presents a linear relationship according to:

$$\psi(\omega)=-N\omega\tau+\frac{\pi}{2} \qquad (14)$$

but it is shifted in phase over $\pi/2$ with respect to that of FIG. 1.

It should be noted for completeness's sake that in order to obtain the phase-inverted pulse signals separate phase-inverting stages 35, 36, 37, 38, 39, 40, 41 may be dispensed with. The phase-inverted pulse signals may directly be derived from the shift register elements 9, 10, 11, 12, 13, 14, since, when the elements 9, 10, 11, 12, 13, 14 are formed by bistable trigger circuits, the phase-inverted pulse signals also appear at these bistable trigger circuits.

It should furthermore be noted that in order to obtain a frequency characteristic expanded in sine terms the phase-inverted pulse signals may be applied to the resistors 28, 29, 30, instead of being applied to the resistors 32, 33, 34.

Figure 3:
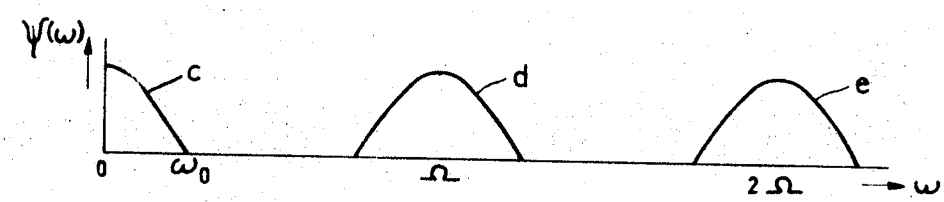
FIGS. 2*a*–*f* shows a few time diagrams and FIG. 3 illustrates an amplitude-frequency characteristic to explain the filter of FIG. 1.
Figure 2:
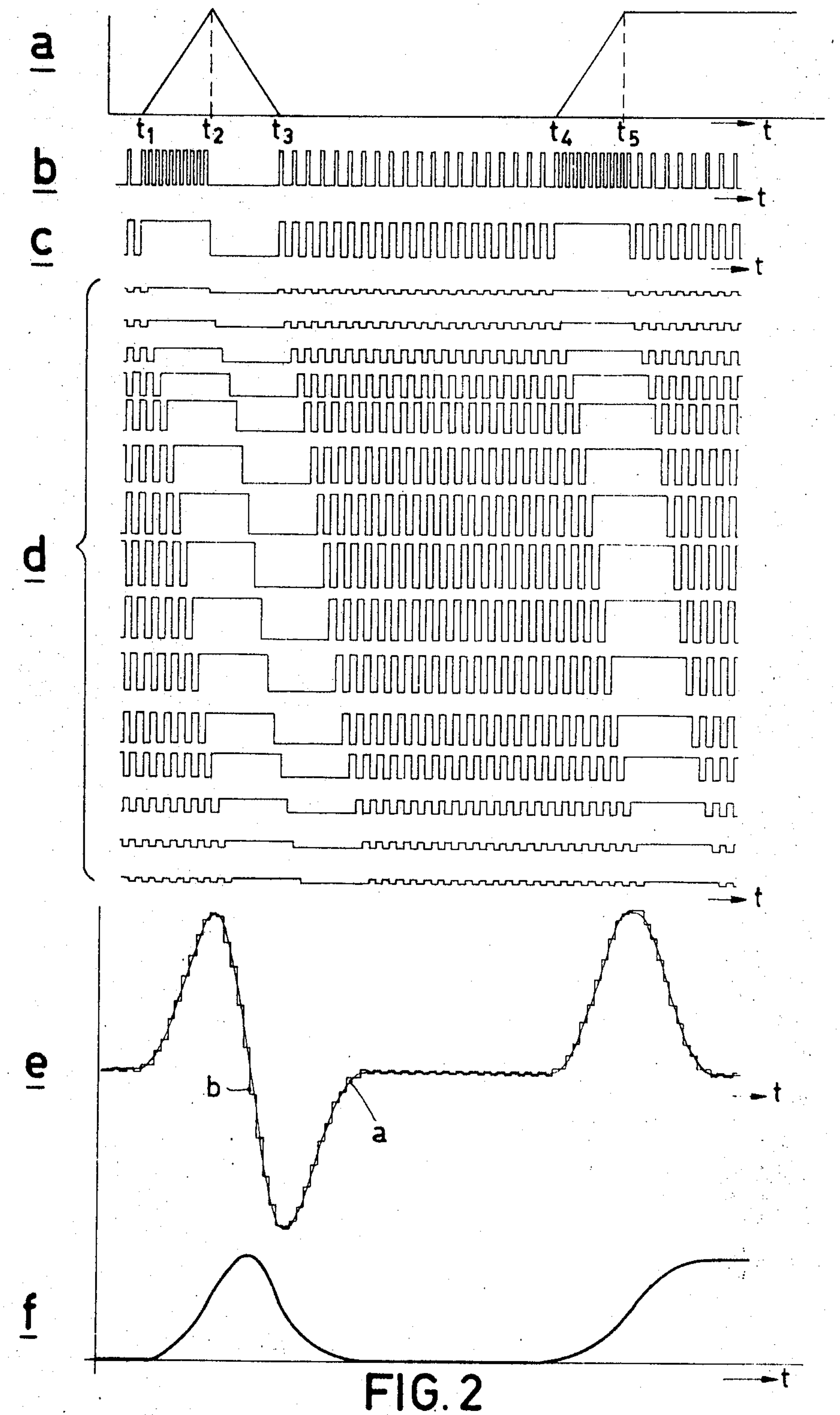
Figure 5:
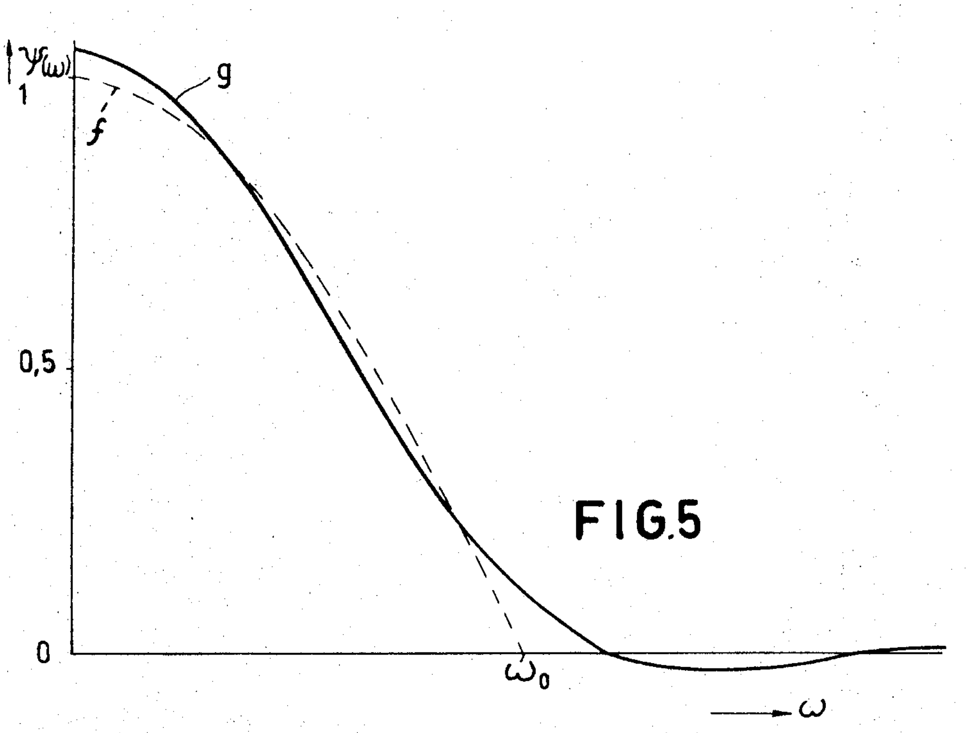
FIGS. 5 and 6 illustrate a few amplitude-frequency characteristics for explaining the filter according to the invention and FIG. 7 shows the attenuation-frequency characteristics corresponding to FIGS. 5 and 6.
Figure 6:
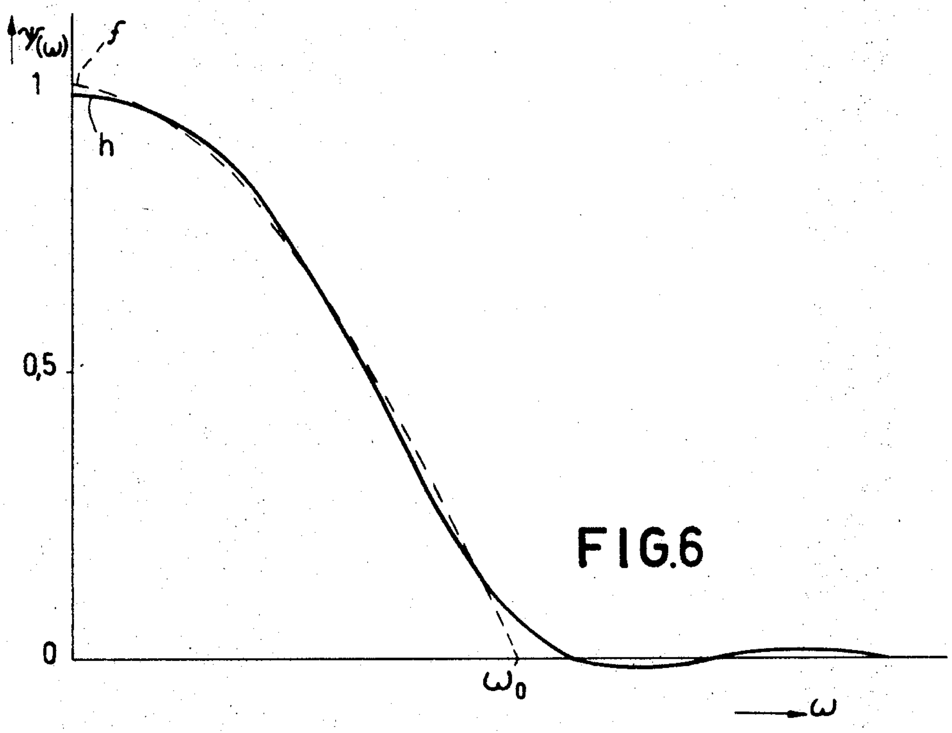
Figure 7:
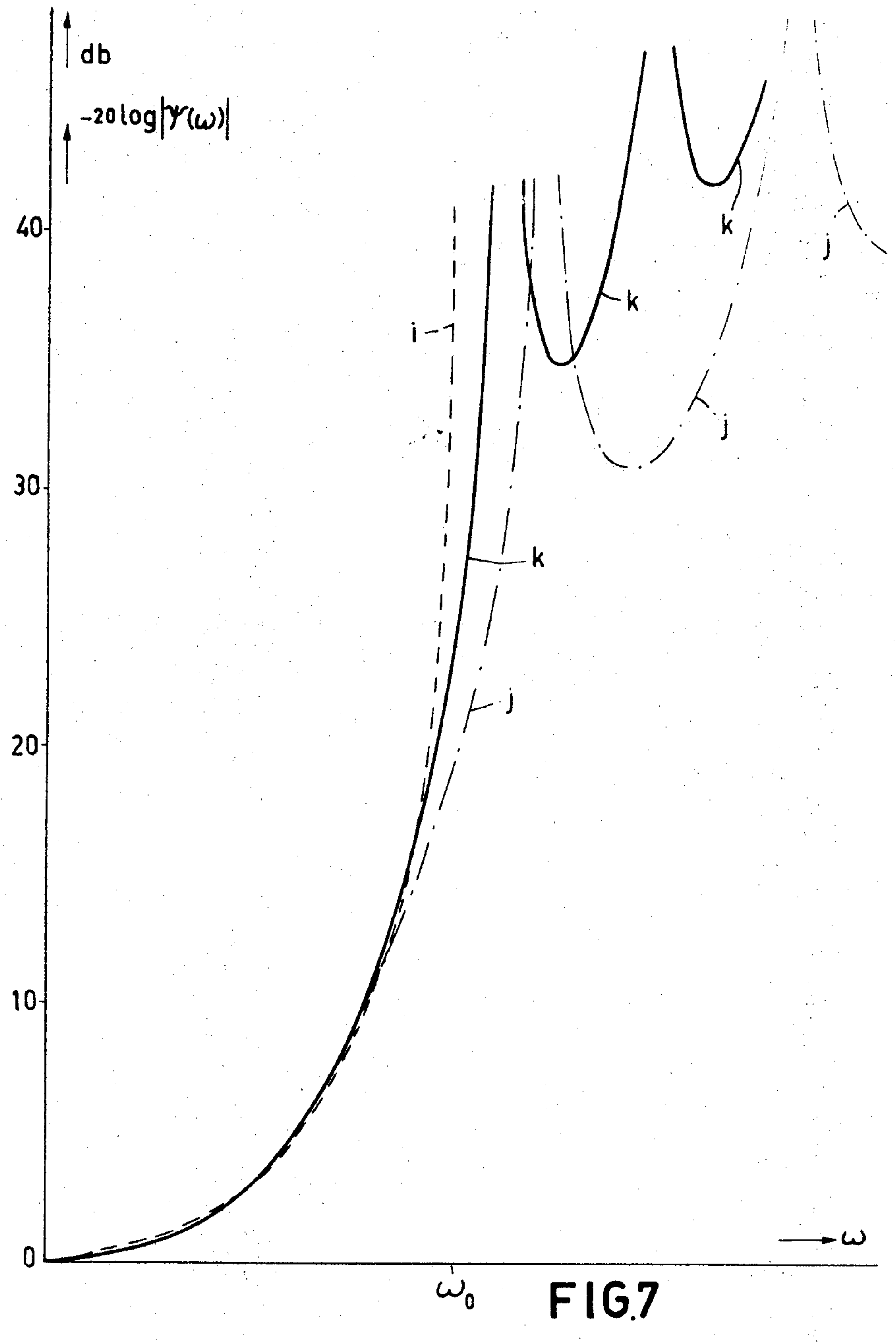

With reference to FIGS. 5 to 7 the construction of the lowpass filter shown in FIG. 2, having a cosinusoidal transfer characteristic with a cutoff frequency $\omega_0$; this pass region is indicated in FIG. 5 by the broken-line curve $f$. Mathematically the pass region indicated by the curve $f$ can be written as:

$$\psi(\omega)=\cos\frac{\pi}{2}\frac{\omega}{\omega_0}$$

on the condition that for frequency values beyond the pass region, that is to say for $\omega>\omega_0$, the function $\psi(\omega)$ varies as shown in FIG. 3.

According to the explanation given above, the transfer characteristic $f$ can be written in Fourier expansion as:

$$C_0+\sum_{1}^{N}2C_k \cos k\omega\tau$$

wherein the coefficients $C_k$ are given by:

$$C_k=\frac{1}{\Omega}\int_0^{\Omega}\psi(\omega)\ \cos k\omega\tau d\omega$$

In order to ensure that the frequency interval between the desired pass region $f$ and the additional pass regions has an adequately large value, the ratio between the cutoff frequency $\omega_0$ and the periodicity $\Omega$ is chosen sufficiently large in accordance with the explanation given with reference to FIG. 3; for example: $\omega_0/\Omega=1/10$.

By this ratio the coefficients $C_k$ in the Fourier expansion and hence also the attenuation resistors are completely determined. In particular coefficients $C_k$ the values given in the explanation of FIG. 2 are found:

$$C_k=\frac{\cos k\pi/5}{2.5\pi(1-0,\ 16k^2)}$$

In order to establish the amplitude-frequency characteristic completely, one further condition has to be fulfilled. Actually, in the embodiment shown it is required that the cutoff frequency $\omega_0$ of the pass region is equal to $1/10$ of the pulse repetition frequency $\omega_p=2\pi f_p$, or else $\omega_p=10\omega_0$. Using the condition that $\omega_0/\Omega$ is equal to $1/10$ and the relation indicated by the Formula 10 being $\Omega\tau=2\pi$, for the shift period of the shift register is found that $\tau=1/(10f_0)=1/f_p$, which means that the frequency multiplier 23, connected to the pulse generator and forming the control-generator of the shift register, must have a frequency multiplication factor of 1 (so that it need not be provided).

By means of the transfer coefficients of the attenuation networks $C_k$, calculated above, and the value of the shift period $\tau=1/(10f_0)=1/f_p$ of the shift register the amplitude-frequency characteristic $\psi(\omega)$ can now be recorded. When 14 shift register elements and 15 attenuation networks are employed, the amplitude-frequency characteristic as denoted by the curve $g$ of FIG. 5 is obtained. When the analog signal of FIG. 2$a$ is applied to the filter having the amplitude-frequency characteristic as denoted by the curve $g$ of FIG. 5 and a linear phase-frequency characteristic, the signal of FIG. 2$f$ represents the output signal, which substantially corresponds to the output signal of an ideal lowpass filter without phase errors and with cosinusoidal pass characteristic up to the frequency $\omega_0$.

Also the amplitude-frequency characteristic curve $\psi(\omega)$ may be recorded, when the number of shift register elements and attenuation networks is increased. The curve $h$ of FIG. 6, for example, represents the amplitude-frequency characteristic for 24 shift register elements and 25 attenuation networks, whereas the broken-line curve $f$ of FIG. 5 illustrates the ideal cosinusoidal pass characteristic.

In order to illustrate the influence of the increase in number of shift register elements and attenuation networks, FIG. 7 shows the frequency characteristics as denoted by the curves *f, g, h* in FIGS. 5 and 6 in the form of the corresponding curves *i, j, k* of the attenuation-frequency characteristic measured in db; the attenuation-frequency characteristic expressed in the amplitude-frequency characteristic $\psi(\omega)$, is given by the formula:

$$-20 \log/\psi(\omega)$$

The curves *i, j, k* of FIG. 7 show that by the increase of the number of shift register elements and attenuation networks not only an improved approximation of the desired attenuation-frequency characteristic *i* but also the pass lobes *j, k* lying beyond the cutoff frequency $\omega_0$ of the pass region are shifted to higher attenuation regions.

As stated above, the construction of a practical filter according to the invention requires that the two following data should be known: in the first place the transfer coefficients $C_k$ of the attenuation networks, which completely determine the shape of the amplitude-frequency characteristic, in this example, the cosinusoidal pass characteristic, and in the second place the shift period $\tau$ dependent upon the cutoff frequency $\omega_0$, by which in the embodiment shown the pulse repetition frequency $\omega_p$ is determined. With a shift period $\tau=1/(10f_0)$, for example, the pulse repetition frequency of the filter is equal to ten times the cutoff frequency. If the shift period $\tau$ is changed, the cutoff frequency will vary, while the shape of the amplitude-frequency characteristic and the linear phase-frequency characteristic are maintained.

Figure 4:
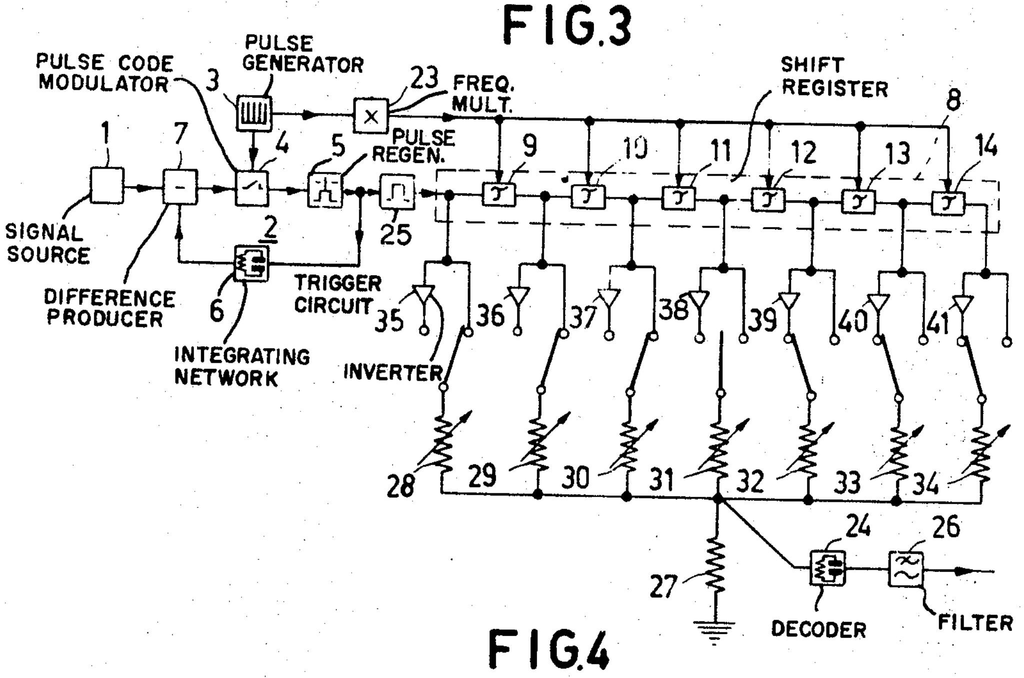
FIG. 4 shows an embodiment of a filter according to the invention in greater detail.

If, for example, in the embodiment of FIG. 1 or FIG. 4 the multiplication factor of the frequency multiplier 23 is varied, while the pulse repetition frequency $\omega_p$ remains the same, the cutoff frequency $\omega_0$ will vary with respect to the pulse repetition frequency $\omega_p$. If, for example, the frequency multiplier is adjustable and if the multiplication factor is changed from 1 to 2, the cutoff frequency of the filter varies from 1/10 of the pulse repetition frequency to 1/5 thereof.

Not only by a convenient construction of the filter according to the invention, in which arbitrary amplitude-frequency characteristics can be realized with linear phase-frequency characteristics, but also by a particularly simple adjustability the filter shown is distinguished and permits of being adapted to the relevant use, while the shape of the amplitude-frequency and the linear phase-frequency characteristic are maintained. The novel conception of the filter according to the invention results in that for analog signals filters can be designed which so far have resulted in impossible constructions, for example, a low pass filter having a cosinusoidal pass characteristic and a linear phase-frequency characteristic, the cutoff frequency being a few cycles or tenths of a cycle.

Considering in addition that the filter according to the invention permits of obtaining arbitrary transfer characteristics, so that not only lowpass filters but also filters of other types can be constructed, for example highpass filters, stop filters, band filters, comb filters, and so on, it may no doubt be stated that the application of the measures according to the invention opens new technical domains.

Figure 8:
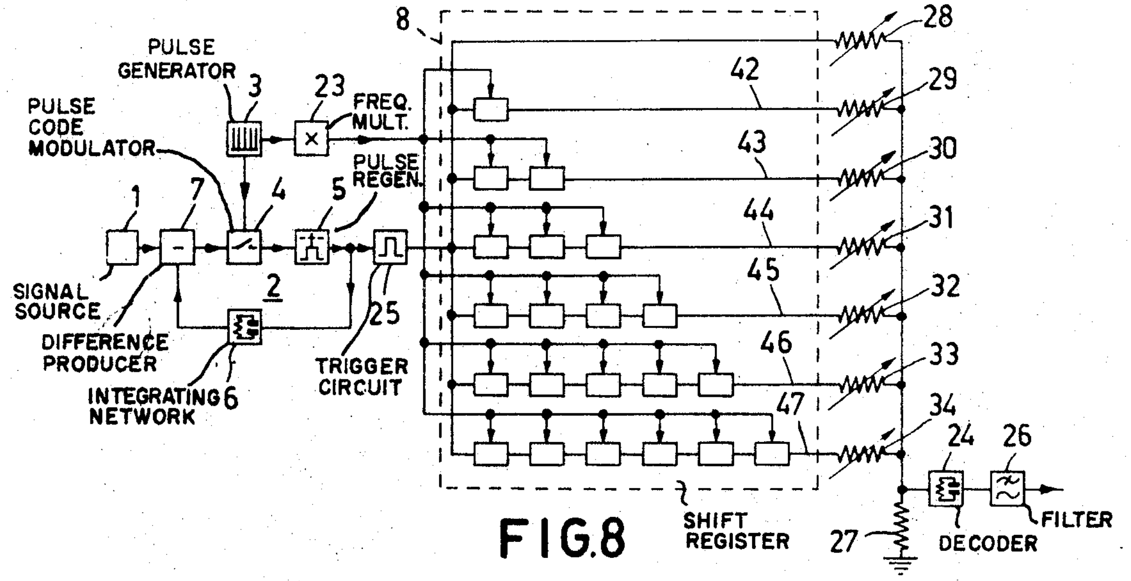
FIG. 8 shows a variant of the filter according to the invention shown in FIGS. 1 and 4.

FIG. 8 shows a variant of a device according to the invention; elements corresponding with those of FIG. 4 are designated by the same reference numerals.

This device differs from the device of FIG. 4 by the construction of the shift register 8, which comprises the parallel arrangement of elements 42, 43, 44, 45, 46, 47, which shift the applied pulse signals over time intervals which mutually differ by the shift period $\tau$. The shift register elements 42, 43, 44, 45, 46, 47 are again connected through attenuation reistors 28, 29, 30, 31, 32, 33, 34 to a combination device formed by a resistor 27, from which the output signal of the device is derived through a suppression filter 26. If desired, phase inverter stages may be connected to the shift register elements 42, 43, 44, 45, 46, 47, which, however, are omitted for the sake of clarity.

As explained above, arbitrary transfer characteristics can be obtained by suitably proportioning the attenuation resistors 28, 29, 30, 31, 32, 33, 34.

In practice the embodiments shown in FIGS. 1 and 4 are preferred, since a considerable saving of component parts is obtained. The shift register elements can be easily manufactured, for example by using, as stated above, bistable trigger circuits composed of resistors and transistors; this embodiment is particularly suitable for integrated circuits, so that the shift register can be built in a space of a few cubic centimetres. If desired, also the attenuation networks may be constructed as integrated circuits.

It should be noted here that in the devices shown in FIGS. 1, 4 and 8 the functions of the decoder 24 and of the filter may be combined by suitably proportioning the attenuation networks connected to the shift register 8, so that the decoder 24 as a separate element, may be omitted. Moreover, the shift register 8 may be used for the construction of the decoder 6 in the delta modulator 2 by connecting the shift register-elements through a second set of attenuation networks, having suitably chosen transfer coefficients, to a second combination device, the output of which is connected to the difference producer 3 in the delta modulator 2.

As stated above, the filtering process of the analog signals is accomplished in the pulsatory output signals of the analog-to-digital converter, said filtering process being completely independent of the relevant pulse code in the analog-to-digital conversion; instead of delta modulation other types of modulation codes may be used.

Figure 9:
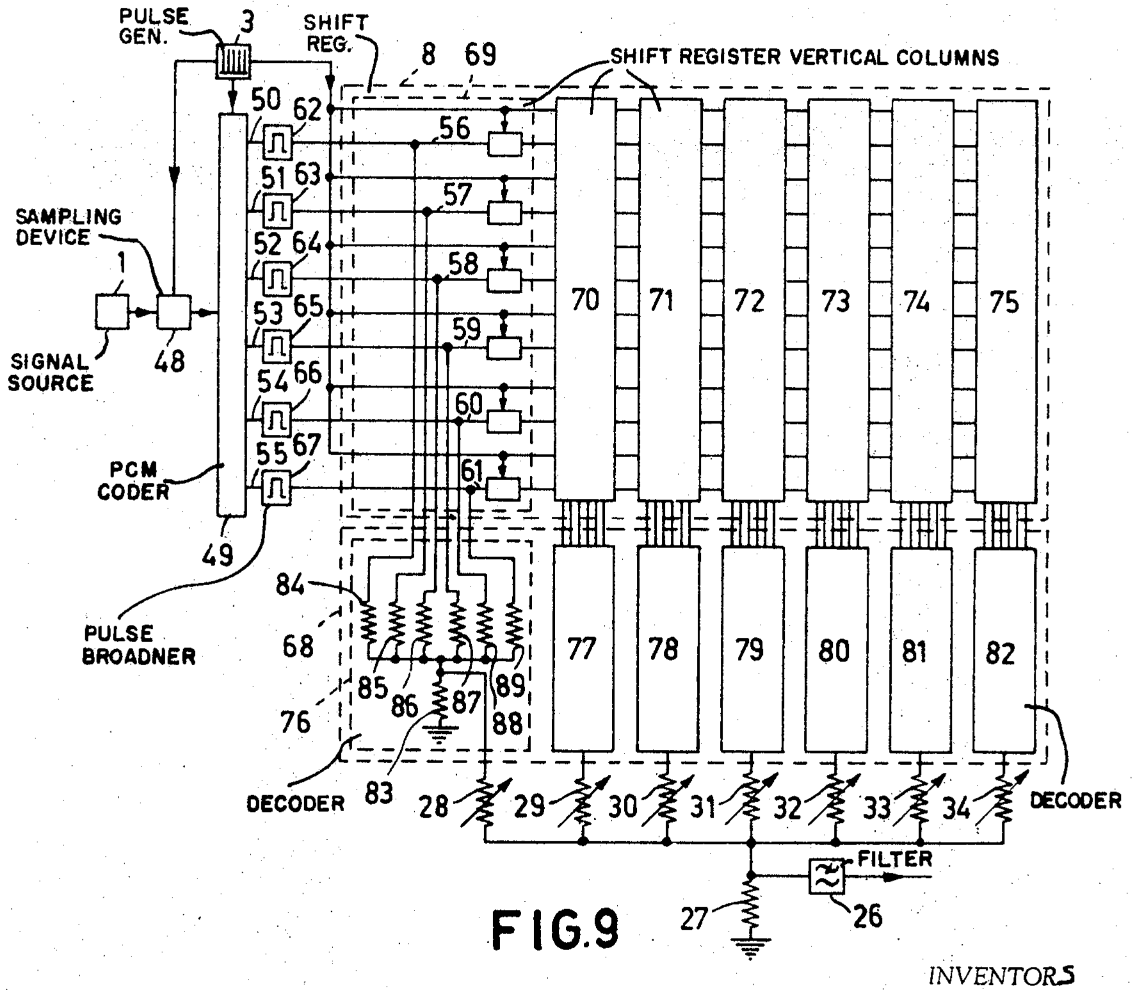
FIGS. 9 and 10 show variants of the filter according to the invention, in which the analog-to-digital conversion is performed by a pulse code known as PCM.
Figure 10:
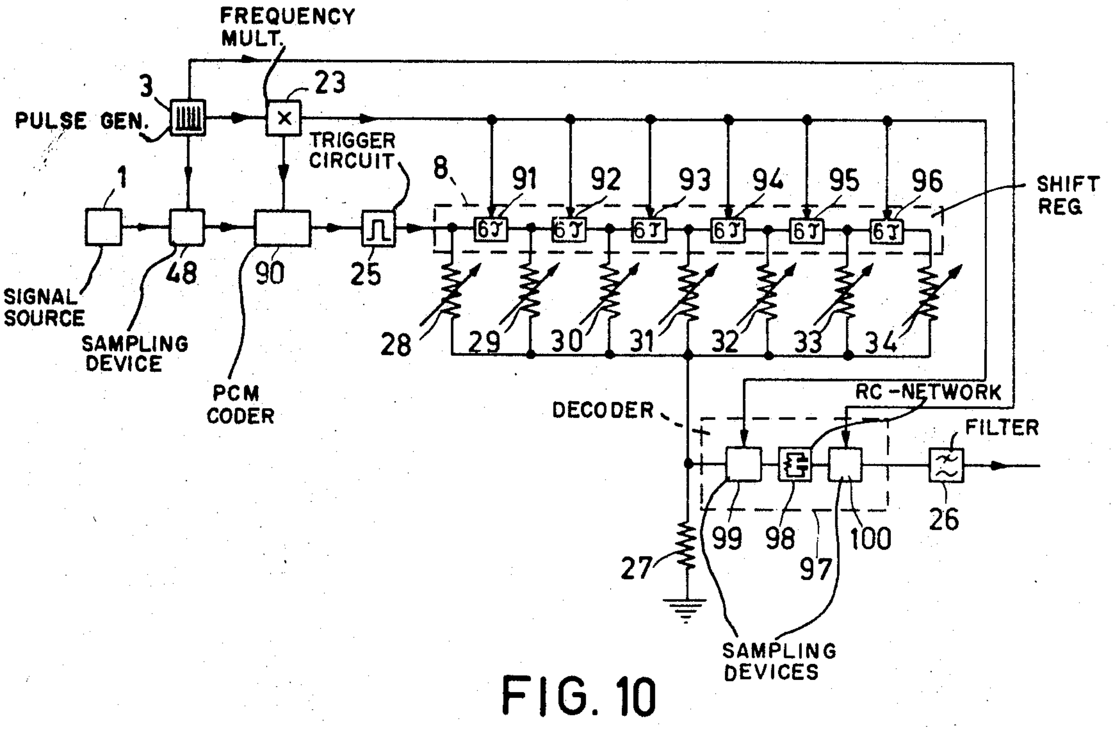

In the embodiment shown in FIGS. 9 and 10 a pulse code is used, generally known under the name of PCM, in which the successive amplitude values of the signal to be coded are characterized by pulse groups of, for example, six code elements, which differ from each other by a weighting factor 2 and which are present and absent for characterizing the amplitude values of the signal to be coded. In this way $2^6$ amplitude values can be distinguished, for example, a pulse group (101101), in which the presence of a code element is designated by 1 and the absence by 0, characterizes an amplitude value:

$$1.2^0+0.2^1+1.2^2+1.2^3+0.2^4+1.2^5=45$$

In the device shown in FIG. 9 samples are taken from the analog signal from a signal source 1 in a sampling device 48, controlled by a pulse generator 3, in the rhythm of the pulse repetition frequency $\omega_p$, said samples being applied to a PCM-coder 49. The analog signal is lying, for example, in the frequency band from 300 to 3400 c./s. and the pulse repetition frequency $\omega_p$ of the pulse generator 3 is at least twice the maximum frequency to be filtered of the analog signal, in particular, 8 kc./s.

Each of the resultant samples is converted in the PCM-coder 49 into a pulse group of six code elements characteristic of the amplitude value of the relevant sample, the six code elements of one pulse group appearing simultaneously, that is to say each code element at its own output conductor 50, 51, 52, 53, 54 and 55 respectively. The figure shows only a block diagram the construction of the PCM-coder, which may be of known type (cf. "Theorie und Technik der Pulsmodulation" by Hölzler and Holzwarth, Springer Verlag 1957, page 453). In a known PCM-coder the samples are converted, for example, by means of a pulse duration modulator into a sequence of duration modulated pulses, which are applied as gating pulses to a gate device, to which a pulse generator is connected, the gate device being followed by a binary counter which counts the pulses of the pulse generator passed during the period of the duration modulated gating pulses, after which the position of the binary counter is transmitted in the form of a pulse group to the six output conductors of the PCM-coder.

In order to obtain the desired filtering effect of the analog signal a shift register 8 is connected to the output of the PCM-coder 49, said register comprising six rows of elements 56, 57, 58, 59, 60, 61, connected in parallel through pulse broadeners 62, 63, 64, 65, 66, 67 with six output conductors 50, 51, 52, 53, 54, 55. The contents of the shift register elements are shifted by the pulses of the pulse generator 3, connected to the sampling device 48. Like in the device shown in FIG. 4 the device of FIG. 9 comprises, apart from the analog-to-digital converter 49 and the shift register 8, a decoder 68, adjustable attenuation resistors 28, 29, 30, 31, 32, 33, 34 and the associated combination device formed by a resistor 27 and an output filter 26; in the embodiment shown each of the vertical columns 69, 70, 71, 72, 73, 74, 75 of the shift register elements is connected via its own decoder 76, 77, 78, 79, 80, 81, 82, to the relevant adjustable attenuation resistor 28, 29, 30, 31, 32, 33 and 34 respectively. The figure shows in detail only the first vertical column 69 with the associated decoder 76; the further vertical columns 70, 71, 72, 73, 74, 75 with the associated decoders 77, 78, 79, 80, 81, 82 are constructed in a similar manner and therefore are illustrated only in a block diagram.

As is illustrated in the first column 69 in the shift register 8, this embodiment comprises as a decoder 76 a resistor network formed by a common resistor 83, connected to each of the shift register elements of the column through decoder resistors 84, 85, 86, 87, 88, 89, the transfer coefficients of which correspond to the weighting factors of the code elements in the pulse groups, which means that the ratio between the transfer coefficients of the resistors 84, 85, 86, 87, 88, 89 is $2^0:2^1:2^2:2^3:2^4:2^5$. For example in the case of the said pulse group (101101) at the shift register elements of the column 69, a pulse having the amplitude value $$1.2^0+0.2^1+1.2^2+1.2^3+0.2^4+1.2^5=45$$

appears at the common resistor 83, which amplitude value apart from a slight quantization noise corresponds completely with the amplitude value of the sample applied to the PCM-coder 49.

When the content of the shift register 8 is shifted in the rhythm of the pulse repetition frequency $\omega_p$ of the pulse generator 3, a pulse having an amplitude value corresponding to that of the sample appears at the outputs of the decoders 76, 77, 78, 79, 80, 81, 82 associated with the various columns 69, 70, 71, 72, 73, 74, 75 in the rhythm of the pulse repetition frequency, the filtered analog signal being obtained in the manner described above via attenuation resistors 28, 29, 30, 31, 32, 33, 34, the combination device 27 and the output filter 26. As stated above, the desired transfer characteristic can be adjusted by the appropriate choice of the transfer coefficients $C_k$ of the attenuation networks.

It should be noted here that the functions of the decoders 76, 77, 78, 79, 80, 81, 82 and of the attenuation resistors 28, 29, 30, 31, 32, 33, 34 may be interchanged or combined in order to obtain the desired filtering effect, for example, by connecting directly all shift register elements through attenuation networks to the combination device and by choosing the variation of the transfer coefficients of the attenuation networks so that this variation along each row of shift register elements corresponds to the shape of the desired transfer characteristic and along each column of shift register elements to the weight of the elements in a pulse group.

FIG. 10 shows a variant of the device of FIG. 9; corresponding elements are designated by the same reference numerals. Instead of using a PCM-coder, in which the code elements of a pulse group appear simultaneously at parallel-connected output conductors, a different type of PCM-coder is employed in this embodiment, for example the type described in U.S. patent application Ser. No. 541,688 filed Apr. 11, 1966 in "Archiv der elektrischen Uebertragung," vol. 19 (1965), pages 453–458, P. Leuthold, "Ein neues Prinzip zur Analog-Digital-Umwandlung," in which the code elements of a pulse group having the weight $2^0$, $2^1$, $2^2$, and so on appear successively at one output conductor. In the embodiment shown the PCM-coder 90 produces six code elements in one pulse group.

In the embodiment shown the pulse groups originating from the PCM-coder 90 and comprising each six code elements are applied through a pulse broadener 25 to a shift register 8, having a number of series-connected shift register elements, the contents of the shift register 8 being shifted with a shift period $\tau$ equal to one period of the frequency of the code elements, obtained by multiplying the pulse repetition frequency $\omega_p$ of the pulse generator 3 in a frequency multiplier 23 by a factor 6. Six shift register elements are united in one group; these groups are designated in the figure by 91, 92, 93, 94, 95, 96 respectively.

At the ends of the successive shift register element groups 91, 92, 93, 94, 95, 96 thus appears always the same code element of the successive pulse groups, which corresponding code elements are shifted in the shift register 8 in the rhythm of appearance of the code elements on the one hand and are applied on the other hand via the attenuation resistors 28, 29, 30, 31, 32, 33, 34 to the combination device 27, which is connected to a decoder 97 with an output filter. In this embodiment the decoder 97 is formed by the known "Shannon-decoder" (cf. "Theorie and Technik der Pulsmodulation" by Hölzler and Holzwarth, Springer Verlag 1957, page 461), formed by a network 98, being the parallel combination of a capacitor and a resistor with appropriate time constant. This network 98 is preceded and followed by a sampling device 99 and 100 respectively, which are controlled by the pulses of the frequency multiplier 23 and by the pulses from the pulse generator 3 respectively. The samples at the output of the sampling device 100 provide the desired analog output signal via the output filter 26.

In practice this device is constructed completely like that shown in FIG. 4; like in FIG. 4 it comprises, in order of succession, an analog-to-digital converter 90, a shift register 8, attenuation resistors 28, 29, 30, 31, 32, 33, 34 with the associated combination device 27, a decoder 97 and an output filter 26. Like in the device in the preceding embodiment, the desired filtering characteristic is obtained by appropriate choice of the attenuation resistors 28, 29, 30, 31, 32, 33, 34 and the analog signal filtered in accordance with this characteristic is derived from the output filter 26.

It should be noted here that the device according to the invention it is not always required to have a linear phase-frequency characteristic. Under given conditions it may even be desirable to introduce a given phase variation. The device may be constructed as a wide-band phase shifting filter in order to correct the phase variation of a given circuit to the desired shape.

What is claimed is:

1. A filter for an analog signal derived from a separate signal source, comprising an analog-to-digital converter coupled to the signal source and converting the analog signal from the signal source intto a pulse sequence characteristic of said signal, a shift register for storing said pulse sequence, the shift register being coupled to the output of the analog-to-digital converter and comprising a number of coupled shift register elements, a control-generator coupled to the shift register for shifting the pulse sequence in said register with a shift period smaller than half the period of the highest frequency to be filtered in the analogue signal, a plurality of transfer networks having transfer characteristics and coupled to each of said shift elements, a combination device coupled to said transfer networks which combines the pulse sequence shifted in the shift register elements each time over a time interval equal to the shift period and a decoder coupled to said combination device.

2. A filter as claimed in claim 1, characterized in that the shift register elements are connected in series.

3. A filter as claimed in claim 1 characterized in that the transfer networks connected to the shift register elements are adjustable.

4. A filter as claimed in claim 1, characterized in that the combination device is formed by a resistor and in that the shift register elements are connected through transfer resistors to the combination device formed by the resistor.

5. A filter as claimed in claim 1 characterized in that by means of phase inverter stages phase-inverted pulse signals are obtained from the shift register elements.

6. A filter as claimed in claim 1 characterized in that the transfer networks are made equal in pairs, starting from the ends of the shift register.

7. A filter as claimed in claim 6, characterized in that pulse signals of equal polarity are applied to the identical transfer networks.

8. A filter as claimed in claim 6, characterized in that pulse signals of opposite polarity are applied to the identical transfer networks.

9. A filter as claimed in claim 1 characterized in that the shift register formed by bistable trigger circuits is constructed as an integrated circuit.

10. A filter as claimed in claim 1 characterized in that the transfer networks are constructed as an integrated circuit.

11. A filter as claimed in claim 1 characterized in that the control generator of the shift register is furthermore connected to the analog-to-digital converter.

12. A filter as claimed in claim 1 characterized in that the control generator is connected through a frequency multiplier to the shift register.

13. A filter as claimed in claim 12, characterized in that the frequency multiplier connected to the control generator is adjustable.

14. A filter as claimed in claim 1 characterized in that the decoder is connected to the output of the combination device.

15. A filter as claimed in claim 1 characterized in that decoders are connected in series with the transfer networks, these series combinations being connected on the one hand to the shift register elements and on the other hand to the combination device.

16. A filter as claimed in claim 1 characterized in that the circuit comprising the shift register elements, the transfer networks and the combination device, is constructed, in addition, as a decoder.

17. A filter as claimed in claim 1 in which the analog-to-digital converter is formed by a delta modulator having a pulse code molulator and a pulse generator connected to said modulator, characterized in that the pulse generator, connected to the pulse code modulator, constitutes at the same time the control-generator of the shift register.

18. A filter as claimed in claim 17, in which via a decoder the output of the delta modulator is connected to a difference producer, at the input of the delta modulator, characterized in that the decoder connected to the difference producer, comprises a second set of transfer networks, connected to the shift register elements and to a second combination device, the output of which is connected to the difference producer.

19. A filter as claimed in claim 1 in which the analog-to-digital converter is formed by a PCM-coder for producing pulse groups, whose code elements of different weights appear in order of succession at one output conductor of the PCM-coder, characterized in that a number of shift register elements corresponding with the number of code elements of a pulse group is united to form one group of shift register elements, the ends of which groups are connected through transfer networks to the combination device, whilst the contents of the shift register elements are shifted with a shift period equal to the time interval between two code elements.

20. A filter as claimed in claim 1 in which the analog-to-digital converter is formed by a PCM-coder for producing pulse groups, whose code elements of different weights appear simultaneously in parallel at their own output conductors of the PCM-coder, characterized in that to each of the parallel-connected output conductors of the PCM-coder there is connected a row of shift register elements, whilst each column of corresponding shift register elements in the parallel rows of shift register elements is connected to the series combination of a decoder and a weighting network.

21. A filter as claimed in claim 20, characterized in that the shift register elements of one column are connected to a common resistor through decoder resistors, the transfer coefficients of which correspond to the weights of the code elements in the relevant rows of shift register elements, whilst the common resistors are connected through attenuation resistors to a combination device formed by a resistor.

22. A filter as claimed in claim 21, characterized in that the shift register elements are connected through decoder resistors, which constitute at the same time attenuation resistors, to a common resistor operating as a combination device.

23. A filter as claimed in claim 1 characterized in that the output of the filter is formed by a suppression filter for the additional pass regions.

References Cited

UNITED STATES PATENTS

| | | | |
|---|---|---|---|
| 3,175,212 | 3/1965 | Miller | 325—38 XR |
| 3,366,947 | 1/1968 | Kawashima et al. | 325—321 XR |
| 3,426,281 | 2/1969 | Klein | 325—324 |

ROBERT L. GRIFFIN, Primary Examiner

R. S. BELL, Assistant Examiner

U.S. Cl. X.R.

178—68; 325—38, 42; 328—37, 142; 340—347